(12) United States Patent  (10) Patent No.: US 8,107,312 B2
Park et al.  (45) Date of Patent: Jan. 31, 2012

(54) MEMORY CHIP ARRAY

(75) Inventors: Jae-chul Park, Seoul (KR); Ki-won Kwon, Seongnam-si (KR); Chung-jung Kim, Yongin-si (KR); Sang-wook Kim, Yongin-si (KR); Sul-il Kim, Yongin-si (KR)

(73) Assignees: Samsung Electronics Co., Ltd., Gyeonggi-do (KR); Sungkyunkwan University Foundation for Corporate Collaboration, Gyeonggi-do (KR)

( * ) Notice: Subject to any disclaimer, the term of this patent is extended or adjusted under 35 U.S.C. 154(b) by 395 days.

(21) Appl. No.: 12/213,121

(22) Filed: Jun. 16, 2008

(65) Prior Publication Data

US 2009/0196084 A1   Aug. 6, 2009

(30) Foreign Application Priority Data

Jan. 31, 2008   (KR) .................. 10-2008-0010291

(51) Int. Cl.
*G11C 8/00*  (2006.01)
(52) U.S. Cl. ............... 365/230.06; 365/51; 365/230.03
(58) Field of Classification Search ............. 365/230.06, 365/51, 230.03
See application file for complete search history.

(56) References Cited

U.S. PATENT DOCUMENTS

| 6,331,963 | B1 | 12/2001 | Cho | |
|---|---|---|---|---|
| 6,735,104 | B2 | 5/2004 | Scheuerlein | |
| 7,190,602 | B2 | 3/2007 | Johnson et al. | |
| 7,583,524 | B2 | 9/2009 | Kang | |
| 2002/0159324 | A1* | 10/2002 | Kawamata | 365/230.06 |
| 2003/0147298 | A1* | 8/2003 | Ooishi et al. | 365/233 |
| 2003/0202404 | A1* | 10/2003 | Scheuerlein | 365/200 |
| 2006/0256616 | A1* | 11/2006 | Honda et al. | 365/185.11 |
| 2007/0153602 | A1 | 7/2007 | Kang | |

FOREIGN PATENT DOCUMENTS

| JP | 5-54664 | 7/1993 |
|---|---|---|
| JP | 6-085185 | 3/1994 |
| JP | 11-297967 | 10/1999 |
| JP | 2004-355762 | 12/2004 |
| KR | 2001-0036710 | 5/2001 |
| KR | 10-2007-0021758 | 2/2007 |
| KR | 10-2007-0071612 | 7/2007 |

OTHER PUBLICATIONS

Johnson, Mark et al. 512-Mb PROM With a Three-Dimensional Array of Diode/Antifuse Memory Cells. IEEE Journal of Solid State Circuits, vol. 38, No. 11, Nov. 2003, pp. 1920-1928.

* cited by examiner

*Primary Examiner* — Anh Phung
*Assistant Examiner* — Toan Le
(74) *Attorney, Agent, or Firm* — Harness, Dickey & Pierce, P.L.C.

(57) ABSTRACT

Example embodiments are directed to a memory chip array including a plurality of cell arrays and at least one predecoder commonly connected to the plurality of cell arrays, wherein the memory chip array promotes an efficient arrangement structure of the memory chip array and is minimized in area.

4 Claims, 8 Drawing Sheets

MEMORY CHIP ARRAY

CROSS-REFERENCE TO RELATED PATENT APPLICATION

This application claims the benefit of Korean Patent Application No. 10-2008-0010291, filed on Jan. 31, 2008, in the Korean Intellectual Property Office, the disclosure of which is incorporated herein in its entirety by reference.

BACKGROUND OF THE INVENTION

1. Field of the Invention

The present invention relates to a memory chip array, and more particularly, to a memory chip array with optimized arrangement by forming a predecoder commonly connected to memory arrays on a region of a memory chip array.

2. Description of the Related Art

As industries and multimedia field develop, a demand for large-capacity information devices being used in computers or telecommunication apparatus is gradually increasing. Due to such a demand, information devices having high integration are being researched and developed.

Semiconductor memory devices have been reducing the size of elements and continuously maximizing the portion integration within a plane given through attempts such as making in a three-dimensional structure. Recently, the size of a portion element has been reduced down to tens of nanometers, and thus the industry faces a great challenge in terms of miniaturizing portion elements.

FIG. 1A is a plan view illustrating a memory chip structure according to prior art. Referring to FIG. 1A, for example, a row decoder 13 including a predecoder 11 and a row select 12 are formed on a first side of a memory cell array 10, and a sense amplifier and a column decoder 14 are formed on a second side of the memory cell array 10. The row decoder 13 and the column decoder 14 are formed individually at every cell array in the memory chip array. The memory chip having such a structure may be formed by, for example, fabricating the row decoder 13, the column decoder 14, and a sense amplifier and the like on a silicon surface, and fabricating a cell array thereon. Recently, a stackable memory structure with a three-dimensional configuration has been introduced. As shown in FIG. 1B, a row decoder R and a column decoder C were arranged on a silicon surface in an alternating manner, and a memory array A was arranged thereon. Such a checkerboard patterned arrangement is known as an arrangement that efficiently utilizes a silicon area.

Such prior art includes several problems. First, referring to FIG. 1B, the edges of memory cells have reduced utilization due to the fabrication of the row decoders R and the column decoders C with half a block size. Second, referring to FIG. 1A, each row decoder 13 is divided into multiple decoders, and among the multiple decoders, the predecoder 11 is located between the cell arrays 10. By having the predecoder 11 for every cell array 10, the overall area of the memory chip array is increased. In order to overcome such problems, a method has been introduced, wherein only the row decoder 13 is formed below the memory cell array, and the sense amplifier and the column decoder 14 are arranged between the cell array blocks or the like. In this case, however, the area of the sense amplifier and the column decoder 14 are significantly large, and thus the overall area of the memory chip array may become larger. Moreover, only a single layered active circuit plane can be formed, and thus forming a multi-layered memory array is limited.

SUMMARY OF THE INVENTION

The present invention provides a memory chip array structure having an arrangement structure such that the area of the memory chip array is minimized.

According to an aspect of the present invention, there is provided a memory chip array including a predecoder commonly connected to the plurality of cell arrays.

The memory chip array includes a row select formed at each side of the cell arrays.

The memory chip may further include a sense amplifier and a column decoder formed at the bottom of the cell arrays.

According to another aspect of the present invention, there is provided a memory chip array comprising:

a plurality of cell arrays storing information;

a row select formed at a side of each of the cell arrays; and a predecoder commonly connected to the plurality of cell arrays.

The predecoder may be formed on both sides of the plurality of cell arrays.

The memory chip array may further include a logic portion formed on a region of the memory chip array.

The logic portion may be formed on the center region of the memory chip array, and the cell arrays are formed on both sides of the logic portion.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
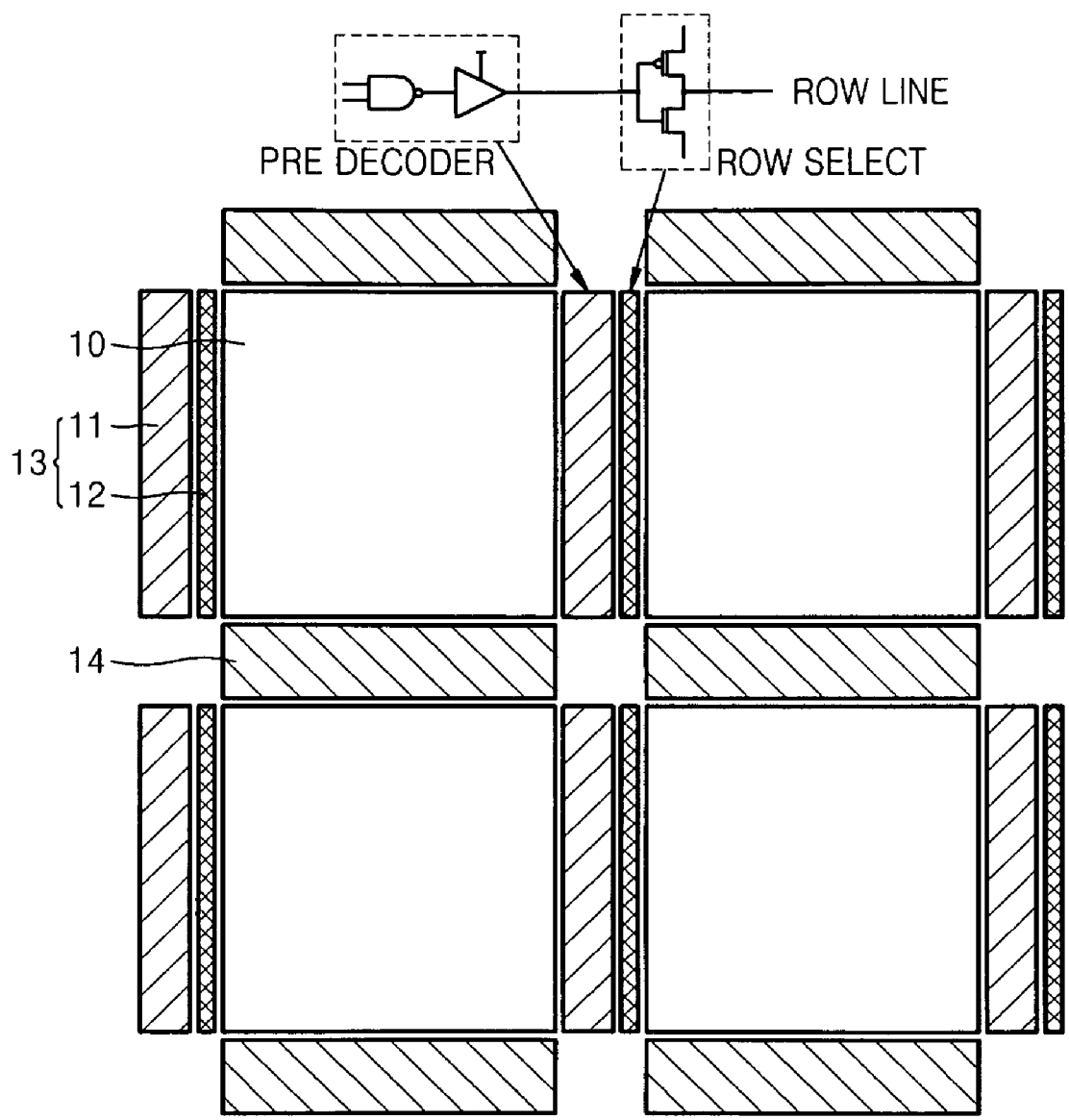
FIGS. 1A and 1B are plan views illustrating memory chip array structures according to prior art.

Hereinafter, the present invention will be described more fully with reference to the accompanying drawings, in which embodiments of the invention are shown. However, it should be understood that the sizes of each region in the drawings are somewhat exaggerated for the purpose of the description.

A memory chip array according to an embodiment of the present invention bears a configuration where only a circuit associated with column movement such as a column decoder and a sense amplifier is disposed at the bottom of a cell array, and a circuit associated with a row is disposed between a plurality of cell arrays and the edges of a chip. Here, a decoder circuit associated with a row uses a multi-partitioned decoder to dispose predecoders with a relatively large area on a side of a plurality of cell arrays, such that a predecoder output can be commonly received by several row select circuits. As a result, by repeatedly disposing only the row select circuits with a small area, the overall area of a memory chip area can be minimized.

Figure 2:
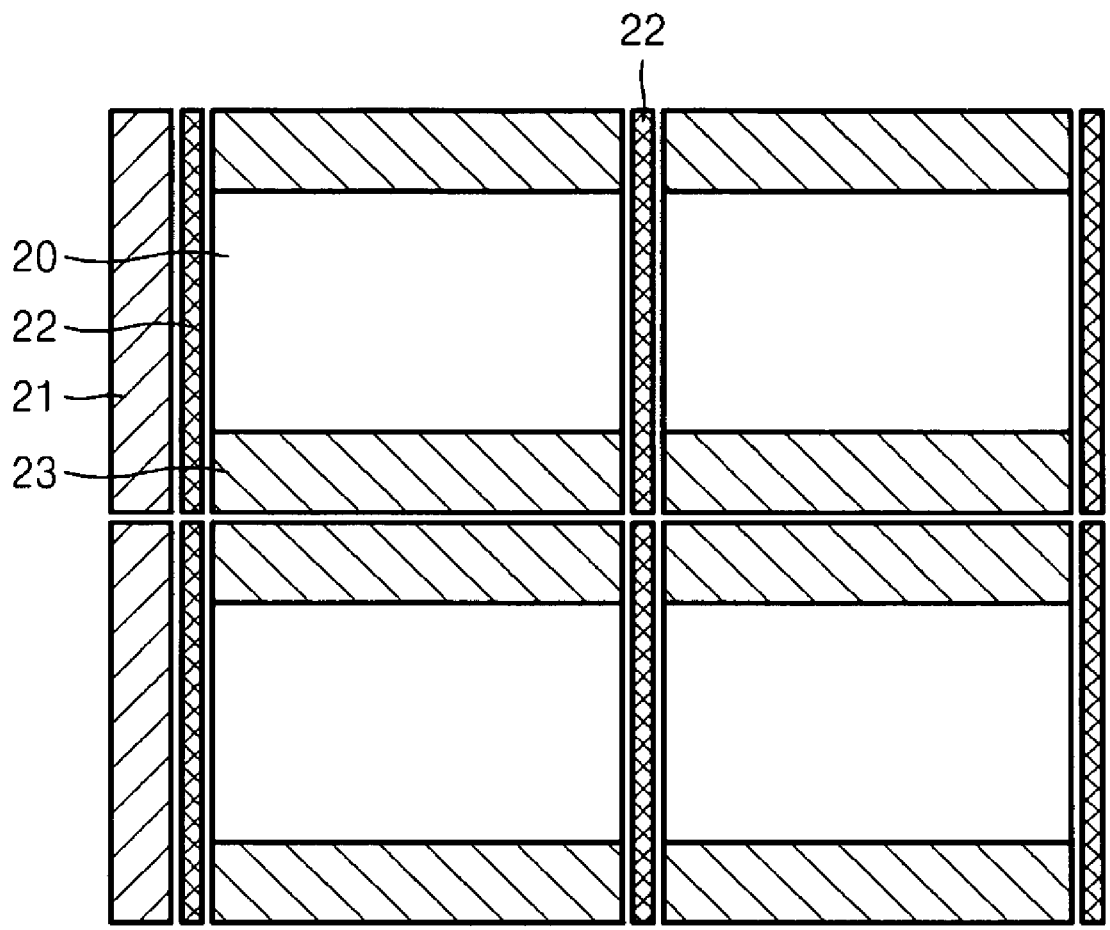
FIG. 2 is a plan view illustrating a memory chip array according to an embodiment of the present invention.

FIG. 2 is a plan view illustrating a memory chip array according to an embodiment of the present invention. Referring to FIG. 2, a row decoder including a predecoder 21 and a row select 22 is formed on a first side of a cell array 20, and a sense amplifier, which is a circuit associated with a column movement, and a column decoder 23 are disposed on a bottom region of the cell array 20.

A description comparing a memory chip array according to an embodiment of the present invention and a conventional memory chip array is as follows.

A conventional memory chip array according to the prior art of FIG. 1A requires a decoder circuit in a row direction, and circuits controlling data input/output such as sense amplifier and column decoder that are a little smaller than the row decoder in the direction of a column must be disposed between cell arrays, and therefore a large area is needed.

Figure 1B:
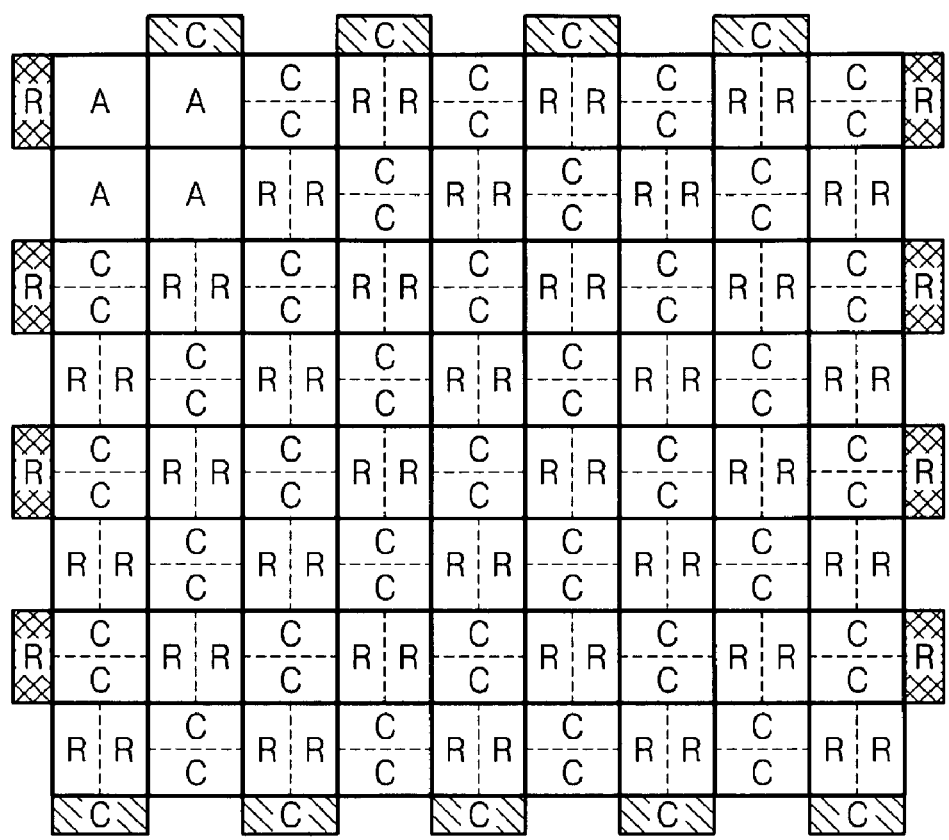

The prior art of FIG. 1B requires additional row decoders and column decoders disposed along the edges of the entire chip, therefore the area occupied is increased. And the row decoder and the column decoder for a single cell array exist on the bottom of the adjacent cell array, making the connection complex, and ensuring a space between the cell arrays for connection is separately required.

The memory chip array according to the present invention includes a row decoder that is partitioned into the predecoder 21 and the row select 22, and the predecoder 21 is formed on a predetermined region of the memory chip array. Therefore, unlike FIG. 1A, a plurality of cell arrays 20 are connected with a single predecoder 21, and thus, the area occupied by the predecoder 21 is minimized and space utilization can be maximized.

Furthermore, only the circuits associated with column direction on the bottom of the cell array 20, for example the sense amplifier and the column decoder 23 are disposed, and on a remaining area of the cell array 20, a VPP (internal voltage increase) generating device or an IVC (internal voltage-decreasing circuit) generator and a detection circuit or the like is disposed. Therefore, the area occupied by the memory chip array can be greatly reduced as compared to the structure with the column decoder 14 disposed outside the cell arrays 10 as shown in FIG. 1A.

Figure 3:
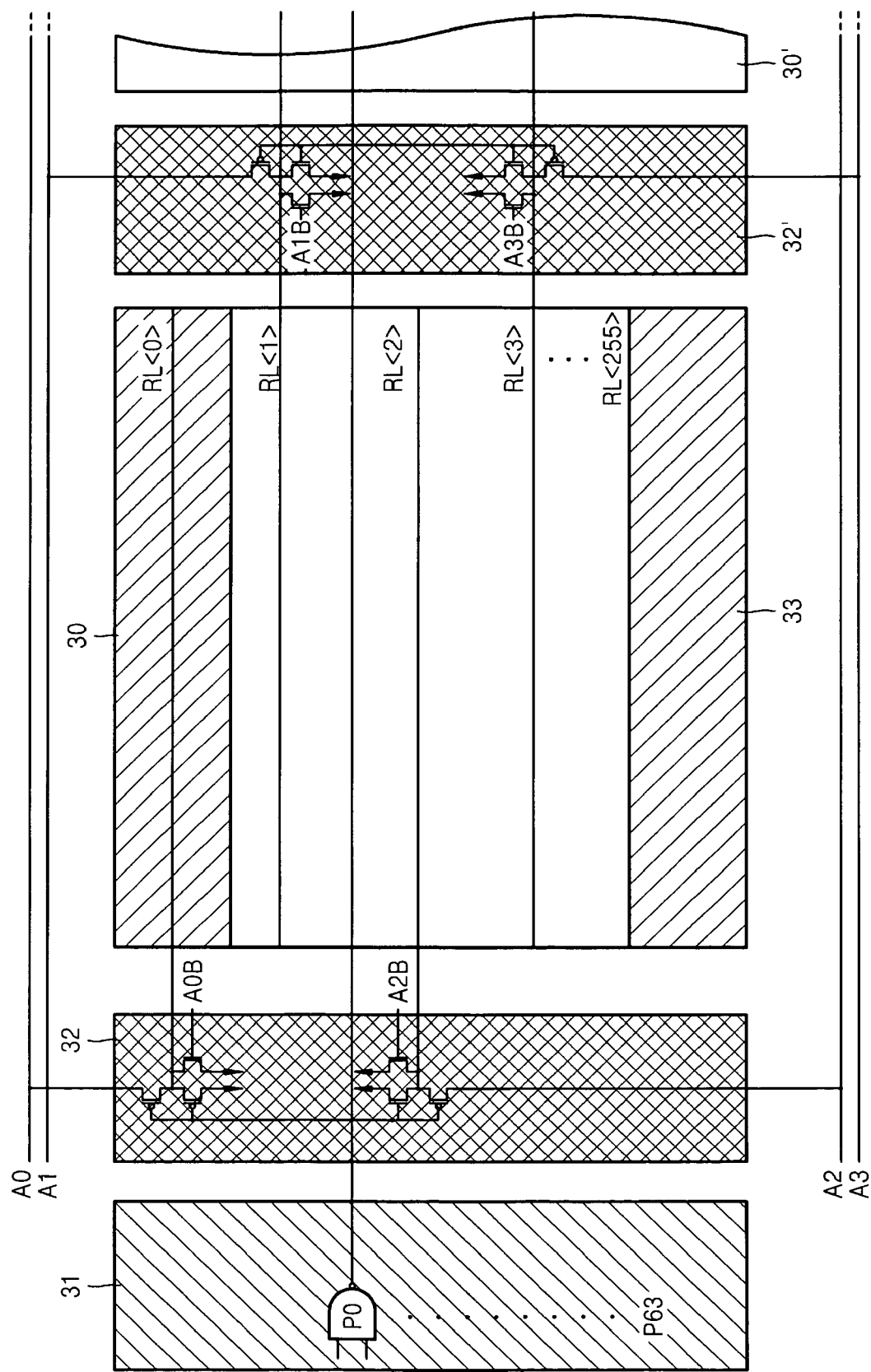
FIG. 3 is a diagram illustrating a circuit configuration of the memory chip array of FIG. 2.

FIG. 3 is a diagram illustrating a circuit configuration of the memory chip array of FIG. 2. Assuming that a single cell array block 30 includes 256 row lines (RL<0>, RL<1> . . . RL<255>), the case where RL<0> is selected may be described as follows. First, P0 is selected from among 64 predecoders 31. Then, if A0 is selected from among 4 A wires (A0, A1, A2, and A3), RL<0> is enabled, and the remaining row lines RL<1>, RL<2>, and RL<3> enter into a disabled state. The predecoders 31 are not only applied to a single row select 32 and the single cell array block 30, but also to a row select 32' and a cell array block 30' beside thereto. As a result, several row selects share predecoder generating input signals.

The overall configurations of a memory chip array according to FIG. 3 are illustrated in FIG. 4 to 7.

Figure 4:
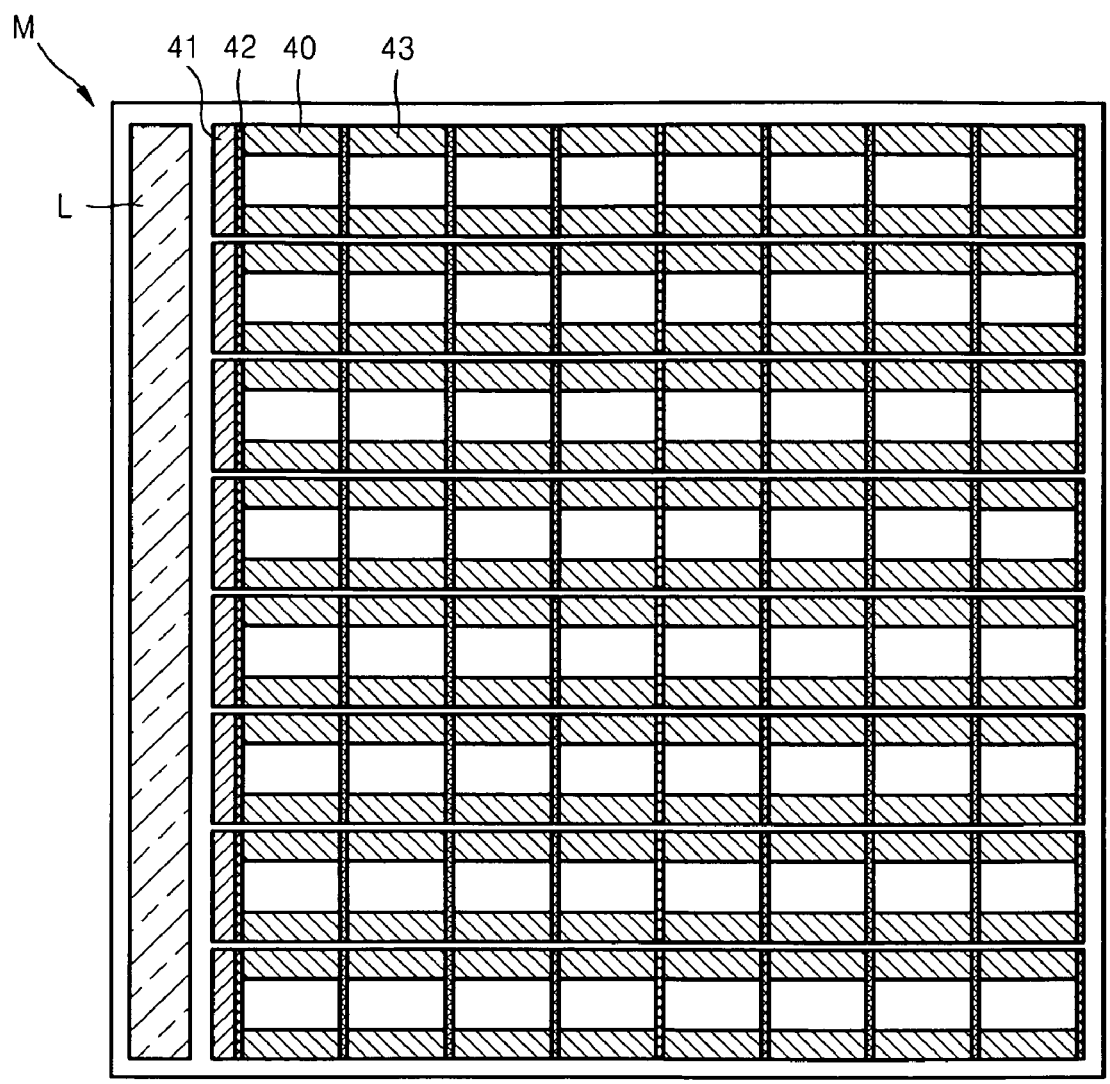
FIGS. 4 to 7 are diagrams illustrating overall configurations of a memory chip array, according to embodiments of the present invention.

Referring to FIG. 4, a plurality of cell arrays 40 storing information are formed on a memory chip array M, and row selects 42, corresponding to row decoders, are each formed on a side of the plurality of cell arrays 40. A sense amplifier, which is a circuit associated with a column direction, and a column decoder 43 are formed on the bottom of each of the cell arrays 40. Predecoders 41 are formed on one side of the plurality of cell arrays 40 so as to be connected commonly to the plurality of cell arrays 40. Moreover, a logic portion L, interpreting the commands, is formed on a predetermined region of the memory chip array M.

The logic portion L and the predecoders 41 on the memory chip array M may be formed on selective regions.

Figure 5:
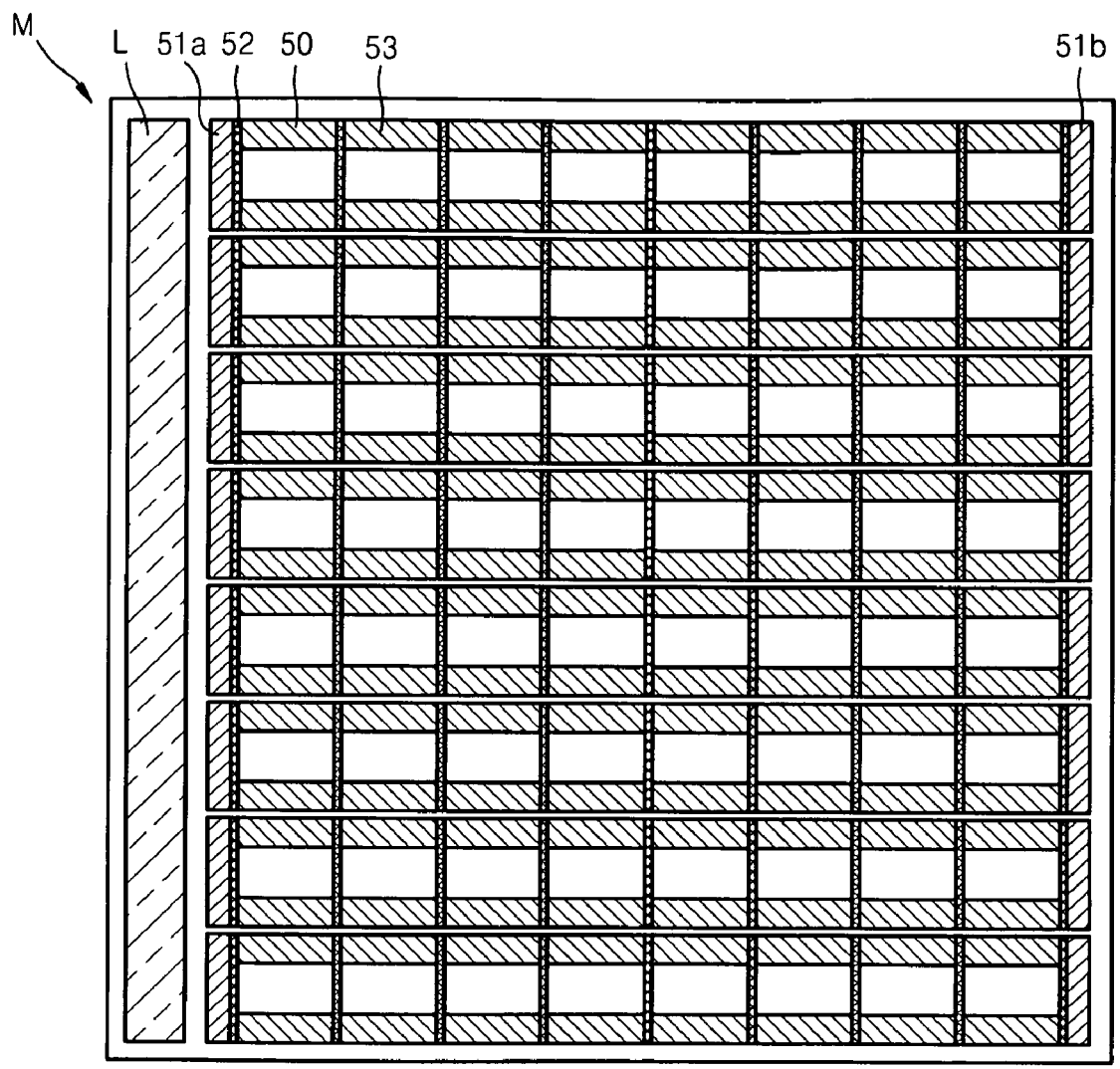

FIG. 5 illustrates a structure of predecoders 51a and 51b formed on both sides of a plurality of cell arrays 50, unlike the structure of the memory chip array M of FIG. 4.

Referring to FIG. 5, a plurality of cell arrays 50 are formed on a memory chip array M, and row selects 52, corresponding to row decoders, are each formed on a side of the plurality of cell arrays 50. On a bottom of each of the cell arrays 50, a sense amplifier, which is a circuit associated with a column direction and a column decoder 53, is formed. Moreover, the predecoders 51a and 51b are formed on both sides of the plurality of cell arrays 50 so as to be commonly connected to the cell arrays 50. Also, a logic portion L, interpreting commands, is formed on a predetermined region of the memory chip array M.

Figure 6:
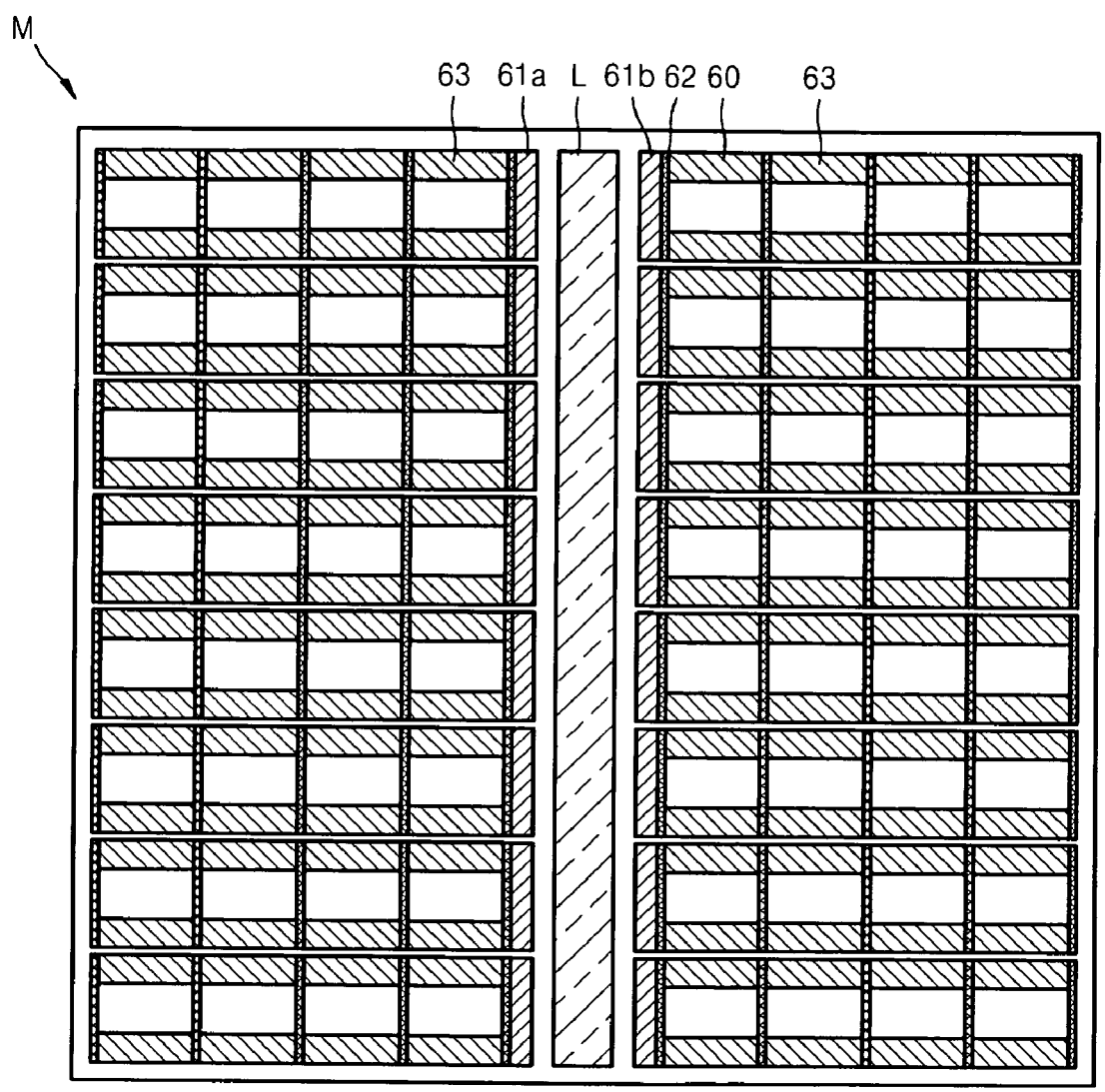

FIG. 6 illustrates a structure where the logic portion L is formed on a center region of the memory chip array M, in contrast to the memory chip array M according to FIGS. 4 and 5.

Referring to FIG. 6, the logic portion L is formed on the center region of the memory chip array M, and a plurality of cell arrays 60 are formed on the left and the right sides of the logic portion L. Row selects 62, corresponding to row decoders, are each formed on one side of the plurality of cell arrays 60, and a sense amplifier, which is a circuit associated with column direction and a column decoder 63, are formed on the bottom of each cell array 60. The predecoders 61a and 61b are formed on one side of the plurality of cell arrays 60 so as to be commonly connected to the plurality of cell arrays 60.

Figure 7:
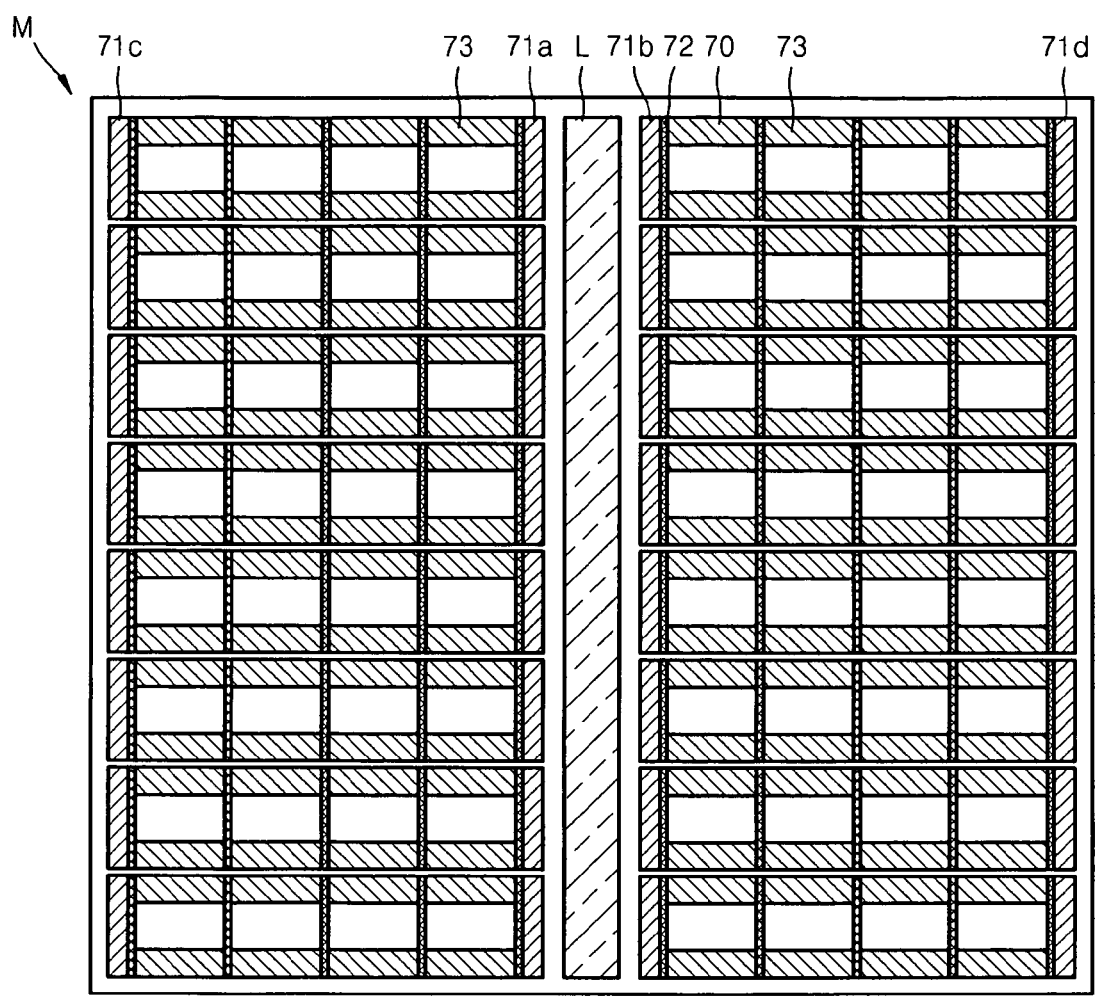

FIG. 7 illustrates a structure where predecoders 71a, 71b, 71c and 71d are formed on both sides of a plurality of cell arrays 70, in contrast to the structure of the memory chip array M according to FIG. 6.

Referring to FIG. 7, a logic portion L is formed on a center region of the memory chip array M, and the plurality of cell arrays 70 are formed on the left and the right sides of the logic portion L. Row selects 72, corresponding to row decoders, are each formed on one side of the plurality of cell arrays 70, and a sense amplifier, which is a circuit associated with column direction and a column decoder 73, are formed on the bottom of each cell array 70. The predecoders 71a, 71b, 71c, and 71d are formed on both sides of the plurality of cell arrays 70 so as to be commonly connected to the plurality of cell arrays 70.

As described previously, the memory chip array according to an embodiment of the present invention includes row selects from among row decoders on one side of the cell arrays storing information, and predecoders are formed so as to be commonly connected to the plurality of cell arrays. Moreover, by disposing only the circuits associated with column movement, such as column decoders and sense amplifiers, the overall chip array area can be minimized.

The stackable memory device may be applicable as a media for various products.

The present invention has the following effects.

First, by forming the predecoders, among the row decoders, on a predetermined region of the memory chip array and commonly connected to every cell array, the efficiency of the memory chip array can be optimized.

Second, by disposing only the circuits, such as a sense amplifier and column decoders requiring a large area, on the bottom region of the cell arrays and associated with the column direction, the overall area of the memory chip area can be reduced.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A memory chip array comprising:
   a plurality of cell arrays storing information;
   at least one row select formed at a side and in between each of the cell arrays; and
   at least one predecoder commonly connected to the plurality of cell arrays and being on both sides of the plurality of cell arrays.

2. The memory chip array of claim 1, further comprising at least one sense amplifier and at least one column decoder formed at the bottom of each of the cell arrays.

3. The memory chip array of claim 1, further comprising a logic portion formed on a predetermined region of the memory chip array.

4. The memory chip array of claim 3, wherein the logic portion is formed on the center region of the memory chip array, and the cell arrays are formed on both sides of the logic portion.

* * * * *